(12) United States Patent
    Baars

(10) Patent No.: US 12,674,827 B2
(45) Date of Patent: Jul. 7, 2026

(54) DETERMINING IMPEDANCE OF PHYSICAL SYSTEM

(71) Applicant: BAARS BEHEER B.V., Eindhoven (NL)

(72) Inventor: Antonie Baars, Eindhoven (NL)

(73) Assignee: BAARS BEHEER B.V., Eindhoven (NL)

( * ) Notice: Subject to any disclaimer, the term of this patent is extended or adjusted under 35 U.S.C. 154(b) by 376 days.

(21) Appl. No.: 18/355,726

(22) Filed: Jul. 20, 2023

(65) Prior Publication Data

US 2024/0044958 A1    Feb. 8, 2024

(30) Foreign Application Priority Data

Aug. 2, 2022    (EP) ..................................... 22188255

(51) Int. Cl.
    *G01R 27/02*    (2006.01)
    *G01M 11/02*    (2006.01)
    *G01N 27/02*    (2006.01)
    *G01N 29/09*    (2006.01)
    *G01N 29/44*    (2006.01)

(52) U.S. Cl.
    CPC ............. *G01R 27/02* (2013.01); *G01M 11/02* (2013.01); *G01N 27/028* (2013.01); *G01N 29/09* (2013.01); *G01N 29/44* (2013.01)

(58) Field of Classification Search
    None
    See application file for complete search history.

(56) References Cited

U.S. PATENT DOCUMENTS

| | | | |
|---|---|---|---|
| 6,002,238 A | 12/1999 | Champlin | |
| 2018/0301320 A1* | 10/2018 | Chen ................. | H01J 37/32183 |

FOREIGN PATENT DOCUMENTS

| | | |
|---|---|---|
| DE | 19825436 A1 | 12/1999 |

OTHER PUBLICATIONS

J.-P. Diard et al., "Theoretical formulation of the odd harmonic test criterion for EIS measurements", Journal of Electroanalytical Chemistry, 377, 1994, pp. 61-73.
M. Kiel, et al., "Harmonic analysis for identification of nonlinearities in impedance spectroscopy", Electrochimica Acta 53, 2008, pp. 7367-7374.

* cited by examiner

*Primary Examiner* — Walter L Lindsay, Jr.
*Assistant Examiner* — Geoffrey T Evans
(74) *Attorney, Agent, or Firm* — NIXON & VANDERHYE P.C.

(57)    ABSTRACT

A system and method are provided for determining an impedance of a physical system based on a ratio of a perturbation to the physical system and a response of the physical system. The determining of the impedance comprises converting a response signal into the frequency domain to identify a magnitude and phase of a first harmonic of the response signal and a magnitude and phase of a third harmonic of the response signal, expressing the magnitude and phase of the first harmonic as a first complex term and expressing the magnitude and phase of the third harmonic as a third complex term, and in determining the impedance, using as the response a sum of at least the first complex term and three times the third complex term. Thereby, a correction may be applied to the impedance measurement to improve accuracy and thereby to allow larger perturbation amplitudes to be used.

15 Claims, 6 Drawing Sheets

600

620

700

710

DETERMINING IMPEDANCE OF PHYSICAL SYSTEM

This application is the claims priority to EP Patent Application No. 22188255.8 filed Aug. 2, 2022, the entire contents of which is hereby incorporated by reference.

FIELD OF THE INVENTION

The invention relates to a system and a computer-implemented method for determining an impedance of a physical system. The invention further relates to a computer-readable medium comprising data of a computer program, the computer program comprising instructions for causing a processor system to perform the method.

BACKGROUND ART

The impedance is an important characteristic of a physical system and may characterize the physical system's response to a time-varying perturbation. Typically, the impedance is expressed as a complex number, namely as a real part (resistance) and an imaginary part (reactance), and may, when expressed in polar form, have a magnitude and phase. The impedance of a physical system may be highly relevant in many real-world applications, such as product testing, for example when testing semiconductors, capacitors, batteries, solar cells, fuel cells, hydrogen generators, etc., or when measuring the electrical power consumption of an electrical system.

It is therefore important to be able to measure the impedance of a physical system. It is known to use instrumentation to measure the impedance of a physical system. Such instrumentation may comprise a perturbation source to generate the perturbation and a response measurement subsystem to measure the response of the physical system to the perturbation. For example, for an electronic or electrochemical system, the perturbation may be an alternating current and the response may be a voltage. Another example is that for a mechanical system, the perturbation may be a harmonic force and the response may be the resistance to the harmonic force.

Standard impedance measurement techniques may assume a linear relation between the perturbation and the response, e.g., between alternating current and voltage, and accordingly may only measure the first harmonic response and assume that the impedance is fully defined by the first harmonic response. However, many natural processes, such as chemical, physical, acoustical, optical, and biological processes, may be non-linear in origin, which may mean that the response of a physical system which incorporates one of these processes may be non-linear as well. The impedance, however, is defined based on the assumption of linearity. In principle, one may determine the impedance by using an infinitely small amplitude to justify linearization. In the real world, however, the perturbation to the physical system may need to have a substantial amplitude to obtain a measurable response of the physical system and/or to ensure sufficient signal-to-noise ratio. Disadvantageously, if the amplitude of the perturbation is too large, due to the aforementioned non-linearities, the physical system may have higher order responses to the perturbation which may not only include higher order harmonics but also a response at the first harmonic. Such higher order responses may therefore disturb the measurement of the 'true' first harmonic response, i.e., the first harmonic response if the physical system were to behave entirely linearly. Therefore, the impedance measurement may be inaccurate.

It is therefore desirable to be able to determine the impedance of a physical system more accurately than standard impedance measurement techniques.

SUMMARY OF THE INVENTION

In accordance with a first aspect of the invention, a system is provided for determining an impedance of a physical system. The system comprises:

an interface for receiving a measurement of a response of the physical system to a perturbation which is applied to the physical system, wherein the perturbation has a perturbation frequency, and wherein the measurement of the response is received in form of a response signal;

a processor subsystem configured to determine an impedance of the physical system based on a ratio of the perturbation and the response, wherein the determining of the impedance comprises:

converting the response signal into a frequency domain to identify a magnitude and phase of a first harmonic of the response signal and a magnitude and phase of a third harmonic of the response signal;

expressing the magnitude and phase of the first harmonic as a first complex term and expressing the magnitude and phase of the third harmonic as a third complex term; and in determining the impedance, using as the response a sum of at least the first complex term and three times the third complex term.

In accordance with a further aspect of the invention, a computer-implemented method is provided for determining an impedance of a physical system. The computer-implemented method comprises:

receiving a measurement of a response of the physical system to a perturbation which is applied to the physical system, wherein the perturbation has a perturbation frequency, and wherein the measurement of the response is received in form of a response signal;

determining an impedance of the physical system based on a ratio of the perturbation and the response, wherein the determining of the impedance comprises:

converting the response signal into a frequency domain to identify a magnitude and phase of a first harmonic of the response signal and a magnitude and phase of a third harmonic of the response signal;

expressing the magnitude and phase of the first harmonic as a first complex term and expressing the magnitude and phase of the third harmonic as a third complex term; and in determining the impedance, using as the response a sum of at least the first complex term and three times the third complex term.

In accordance with a further aspect of the invention, a transitory or non-transitory computer-readable medium is provided. The computer-readable medium comprises data representing a computer program, the computer program comprising instructions for causing a processor system to perform the aforementioned method.

The above aspects of the invention involve determining, by calculation, the impedance of a physical system. As is known per se, the impedance may be defined by the ratio of the perturbation applied to the physical system and the response of the physical system to the perturbation. The perturbation may be a time-varying perturbation at a nominal perturbation frequency, any may typically have the form of a sine wave with a chosen frequency. The response of the physical system may be measured, and as a result of the measurement, a response signal may be obtained which in digital form represents the response of the physical system. Likewise, the perturbation may be measured, or parameters defining the perturbation may be known to the system and method. The impedance may then be determined as the ratio of the perturbation and the response and may take the form of a complex number having a real and an imaginary part and may be expressed in terms of magnitude and phase.

For the impedance calculation, the first harmonic response of the physical system to the perturbation may be of most interest, as the definition of impedance may assume linearity of the physical system and in accordance with this definition the response of the physical system should consist of only a first harmonic response, i.e., a response at the fundamental frequency of the perturbation, i.e., at the perturbation frequency. As such, conventionally, in the calculation of impedance, the first harmonic response is determined, e.g., by converting the response signal into the frequency domain, for example into the Fourier domain using a fast Fourier transform (FFT), and by determining the magnitude and phase of the first harmonic in the frequency domain.

Disadvantageously, if the amplitude of the perturbation is substantial, non-linearities in the response of the physical system may disturb the first harmonic response, in that the measured magnitude and phase may not accurately reflect the 'true' first harmonic response, i.e., the first harmonic response if the physical system were to behave entirely linearly. In accordance with the above measures, a correction may be applied to the first harmonic response. Namely, as is demonstrated elsewhere in this specification, the first harmonic response may be measured in a manner known per se, e.g., by determining, in the frequency domain, the magnitude and phase of the response of the physical system at the fundamental frequency. A correction may then be applied to this first harmonic response, which may be explained as follows: as demonstrated by Taylor expansion and Fourier analysis, higher order responses of the physical system may not only occur at their respective higher order harmonic frequencies, but also at the fundamental frequency. This in particular holds for all odd order responses, e.g., the third order, fifth order, etc. responses of the physical system.

The effect of the third order response on the first harmonic has been analytically determined to correspond to, when expressed as a complex term, minus three times the complex term which represents the third harmonic response. As such, a correction may be applied to the first harmonic response to compensate for this distortion. In particular, this correction may be expressed in the complex domain by expressing the magnitude and phase of the first harmonic as a first complex term, expressing the magnitude and phase of the third harmonic as a third complex term, and using for the response of the first harmonic a sum of at least the first complex term and three times the third complex term, rather than simply the complex representation of the measured magnitude and phase of the first harmonic. In other words, in the calculation of the impedance, the vector representing the third harmonic response is multiplied by three and used as correction vector to the vector representing the first harmonic response. Thereby, the distortion of the first harmonic response by the physical system's third order response is reduced, leading to a more accurate measurement of the impedance of the physical system. This improvement in accuracy may allow larger perturbation amplitudes to be used while maintaining sufficient accuracy, which in turn may improve the signal-to-noise ratio of the measurement.

In this respect, it is noted that the adjective 'first', 'third' etc. when referring to a complex term is only to uniquely identify the respective complex terms, as the adjectives have been chosen to match those of the harmonic responses to which they correspond. Accordingly, the presence of a 'third' complex term in the summation does not in any way imply that the summation also comprises a 'second' complex term.

Optionally, the processor subsystem is further configured to:

> identify a magnitude and phase of a fifth harmonic of the response signal and express the magnitude and phase of the fifth harmonic as a fifth complex term;
>
> in determining the impedance, use as the response the sum of at least the first complex term, three times the third complex term, and five times the fifth complex term.

While the influence of the third order response on the impedance may be most significant, other higher odd order responses may also disturb the first harmonic response of the physical system and thereby disturb the impedance measurement.

Accordingly, in some embodiments, the correction may be extended to also correct for the distortion of the first harmonic by the fifth order response, which correction involves expressing the magnitude and phase of the fifth harmonic as a fifth complex term and including five times the fifth complex term in the summation.

Optionally, the processor subsystem is further configured to:

> identify a magnitude and phase of a seventh harmonic of the response signal and express the magnitude and phase of the seventh harmonic as a seventh complex term;
>
> in determining the impedance, use as the response the sum of at least the first complex term, three times the third complex term, five times the fifth complex term, and seven times the seventh complex term.

While the influence of the third order response on the impedance may be most significant, which may be followed by the influence of the fifth order response on the impedance, other higher odd order responses may also disturb the impedance. Accordingly, in some embodiments, the correction may be extended to also correct for the distortion of the first harmonic by the seventh order response, which correction involves expressing the magnitude and phase of the seventh harmonic as a seventh complex term and including seven times the seventh complex term in the summation.

Optionally, the processor subsystem is further configured to:

> identify a magnitude and phase of a nineth harmonic of the response signal and express the magnitude and phase of the nineth harmonic as a nineth complex term;
>
> in determining the impedance, use as the response the sum of at least the first complex term, three times the third complex term, five times the fifth complex term, seven times the seventh complex term, and nine times the nineth complex term.

While the influence of the third order response on the impedance may be most significant, followed by the influence of the fifth and seventh order responses on the impedance, other higher odd order responses may also disturb the impedance. Accordingly, in some embodiments, the correction may be extended to also correct for the distortion of the first harmonic by the nineth order response, which correction involves expressing the magnitude and phase of the nineth harmonic as a nineth complex term and including nine times the nineth complex term in the summation.

Optionally, the processor subsystem is configured to estimate a signal-to-noise ratio of the measurement of the response signal and to determine which maximum order of odd harmonics to include in the sum based on the signal-to-noise ratio. While correcting for higher order responses may in principle improve the accuracy of the impedance, the magnitude of higher order harmonics may be more difficult to measure as the signal-to-noise ratio may be low(er) relative to the magnitude of lower order harmonics, e.g., the first and third harmonics. In addition, the multiplication factor increases with an increasing order, e.g., seven times for the seventh order and nine times for the nineth order, etc., which may mean that noise may be more amplified for higher order responses, and thus, the correction of higher order responses may be more susceptible to noise. To address this problem, the system and method may estimate the signal-to-noise ration of the measurement of the response signal, e.g., in a manner known per se, and limit the maximum order of correction accordingly. For example, for a higher signal-to-noise ratio, the maximum order may be limited to a lower number. In a specific example, if the signal-to-noise ratio is below a threshold, the correction may be limited to the third order response, while if the signal-to-noise ratio is above the threshold, the correction may be extended to include the fifth order response. Such a threshold may for example be static or may be adaptively chosen.

Optionally, the system further comprises a response measurement device for measuring the response of the physical system, wherein the interface is an internal interface of the system. The response measurement device may be part of the system, i.e., an internal component. In other embodiments, the response measurement device may be an external part of the system. For example, the system may be a PC which may be connected to a voltmeter functioning as response measurement device.

Optionally, the system further comprises a perturbation source for generating the perturbation. For example, the perturbation source may be a current source which may be an internal component of the system.

Optionally, the perturbation is available to the system in form of a perturbation signal, wherein the perturbation signal represents a measurement of the perturbation. The perturbation may be measured, e.g., by the system itself or by another entity, which may be more accurately than other quantifications of the perturbation, such as using nominal parameters of the perturbation.

The above measures may be applied to various types of impedance measurements. For example, the physical system may be an electronical system or an electrochemical system or a biological system, wherein the perturbation is an alternating current, and wherein the response is a voltage. Another example is that the physical system is a mechanical system, wherein the perturbation is a harmonic force, and wherein the response is a resistance to the force. Yet another example is that the physical system is an optical system, wherein the perturbation is in form of emitted light, and wherein the response is in form of reflected or transmitted light or in form of an electrical response. Yet another example is that the physical system is an acoustic system, wherein the perturbation is an acoustic pressure, and wherein the response is an acoustic volume flow rate. In general, examples of physical systems include animate and inanimate objects, parts of objects, systems comprised of several objects, etc.

It will be appreciated by those skilled in the art that two or more of the above-mentioned embodiments, implementations, and/or optional aspects of the invention may be combined in any way deemed useful.

Modifications and variations of any system, device, computer-implemented method or any computer-readable medium, which correspond to the described modifications and variations of another one of said entities, can be carried out by a person skilled in the art on the basis of the present description.

BRIEF DESCRIPTION OF THE DRAWINGS

These and other aspects of the invention will be apparent from and elucidated further with reference to the embodiments described by way of example in the following description and with reference to the accompanying drawings, in which.

It should be noted that the figures are purely diagrammatic and not drawn to scale. In the figures, elements which correspond to elements already described may have the same reference numerals.

LIST OF REFERENCE NUMBERS AND ABBREVIATIONS

Figure 1:
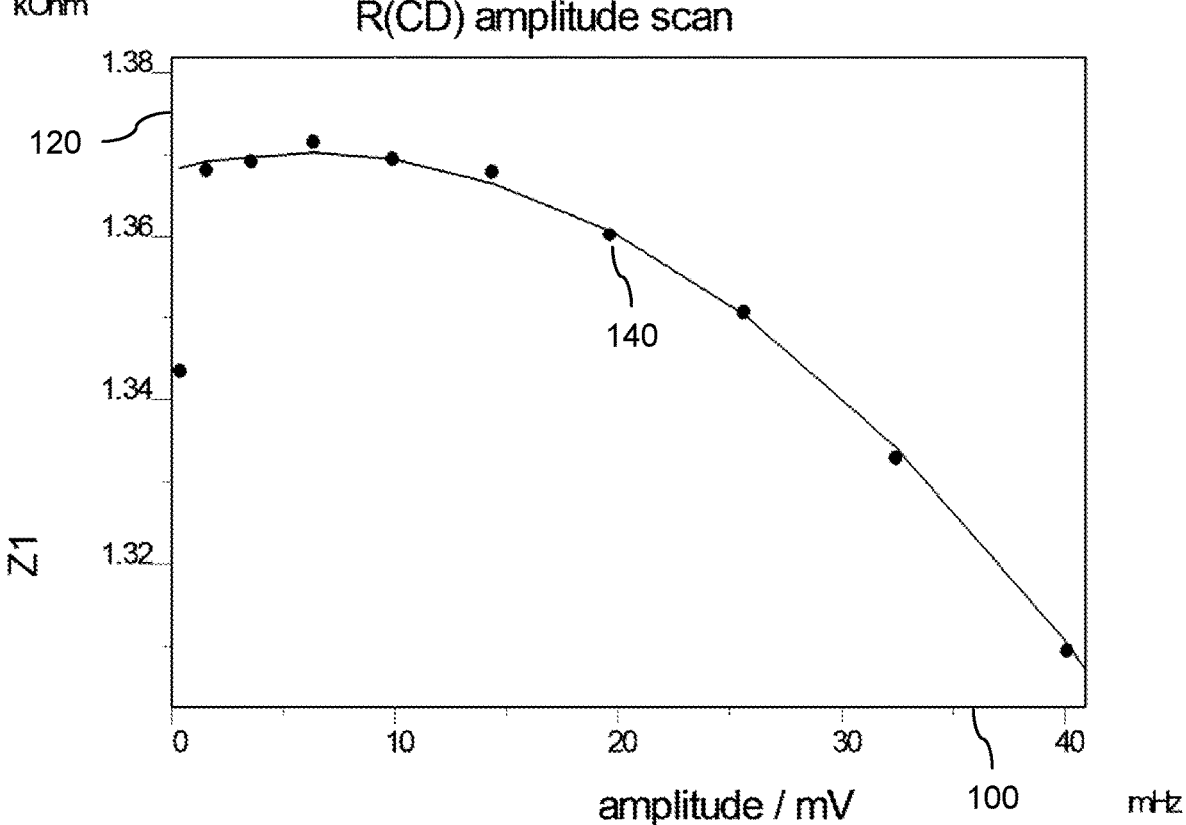
FIG. 1 illustrates the effect of the amplitude magnitude on a diode on the apparent impedance of the first harmonic, showing increasing deviations above 10 mV.

The following list of reference numbers is provided for facilitating the interpretation of the drawings and shall not be construed as limiting the claims.

100 amplitude in mV
120 impedance in kiloohm
140 experimental measurement values from a BAS42 diode
200 amplitude in V
220 error percentage
240 conventional method, uncorrected
242 after 3rd order correction
244 after 3rd and 5th order correction
246 after 3rd, 5th, and 7th order correction
248 after 3rd, 5th, 7th, and 9th order correction
300 amplitude in mV
320 impedance in ohm
340 conventional method, uncorrected
342 after 3rd and 5th order correction
400 impedance (real part)

420 impedance (imaginary part)
440 50 mV amplitude, uncorrected
442 5 mV amplitude, uncorrected
444 50 mV amplitude after 3rd and 5th order correction
460 electronic network
500 system for determining complex impedance
510 interface to perturbation source
515 perturbation source (current source)
520 interface to response measurement device
525 response measurement device (voltmeter)
530 processor subsystem
540 memory
560 interface to computer
570 computer
580 display
600 method of determining complex impedance
610 receiving measurement of response to perturbation
620 determining complex impedance
630 converting response to frequency domain
640 expressing magnitude and phase as complex terms
650 correcting complex term of first harmonic
700 non-transitory computer-readable medium
710 stored data

DETAILED DESCRIPTION OF EMBODIMENTS

FIG. 1 shows along the vertical axis 120 the impedance of a BAS42 diode in kiloohm as a function of the amplitude of an AC input signal on the horizontal axis 100 in mV. As can be seen from the experimental measurement values 140, which were obtained using a conventional impedance mea- The potentiostatic perturbation may have the form of $V_s(t) = V_0 + v_s(t)$, in which $v_s(t) = A \sin(\omega t)$, meaning that only a first harmonic is present in the applied input signal, i.e., in the perturbation. The current $I_s(t)$ through the cell may be expressed as a function of voltage, and the current/time relation at $V_s = V_0$ may be modelled by generic Taylor expansion, which may result in the following expression:

$$I_s(t) = \left[ x_1 v_s(t) + \frac{x_2}{2} v_s^2(t) + \frac{x_3}{6} v_s^3(t) + \frac{x_4}{24} v_s^4(t) + \frac{x_5}{120} v_s^5(t) \right]$$

in which $$x_n = \frac{d^n I}{d^n V}$$

and in which the DC component $V_0$ is omitted for ease of explanation. This expression may then be converted to the frequency domain by using, for each of the time domain $v_s(t)^n$ terms, the corresponding frequency domain term $$v_s^n(\omega),$$

namely by substitution by the equations shown in Table 1 below.

TABLE 1

| $v_s(t)^n$ developed in Goniometric components and Fourier terms with $f(\omega) = \delta(\omega - \omega_0)$ | | | |
|---|---|---|---|
| | Equation in timedomain | Fourier term | Equation in frequency domain |
| $v_s(t)$ | $A \sin(\omega t) \rightarrow$ | $v_s(\omega)$ | $-Ai\, f(\omega)$ |
| $v_s(t)^2$ | $\frac{A^2}{2}(1 - \cos(2\omega t))$ | $v_s^2(\omega)$ | $\frac{A^2}{2}(f(0) - f(2\omega))$ |
| $v_s(t)^3$ | $\frac{A^3}{4}(3\sin(\omega t) - \sin(3\omega t))$ | $v_s^3(\omega)$ | $\frac{A^3}{4}(-3if(\omega) + if(3\omega))$ |
| $v_s(t)^4$ | $\frac{A^4}{8}(3 - 4\cos(2\omega t) + \cos(4\omega t))$ | $v_s^4(\omega)$ | $\frac{A^4}{8}(3f(0) - 4f(2\omega) + f(4\omega))$ |
| $v_s(t)^5$ | $\frac{A^5}{16}(10\sin(\omega t) - 5\sin(3\omega t) + \sin(5\omega t))$ | $v_s^5(\omega)$ | $\frac{A^5}{16}(-10if(\omega) + 5if(3\omega) - if(5\omega))$ | surement technique, the impedance decreases for amplitudes above 10 mV. The reason for this decrease has been found to be harmonic distortions in the impedance measurement, which harmonic distortions become exponentially stronger for larger amplitudes of the input signal.

In accordance with the embodiments described in this specification, a correction may be applied to the first harmonic response as measured, which may be further explained as follows. Here, by way of example, the physical system is a cell, and the perturbation is a potentiostatic (controlled voltage) perturbation. It will be appreciated, however, that the following also applies to physical systems other than cells and to perturbations other than a controlled voltage, mutatis mutandis.

With $V_p = -iA$, the Fourier term of the applied perturbation voltage harmonic frequency may take the form of:

$$V_P = -iA; \; V_P^2 = -A^2; \; V_P^3 = iA^3; \; V_P^4 = A^4; \; V_P^5 = -iA^5$$

With continued reference to Table 1, when substituting A by $V_p$ in the right column of Table 1, the following expressions are obtained as shown in Table 2.

TABLE 2

The Fourier terms as a function of applied complex voltage $V_p$:

| Fourier term | Equation |
|---|---|
| $v_s(\omega)$ | $V_p f(\omega)$ |
| $v_s^2(\omega)$ | $\frac{1}{2}\left(-V_p^2 f(0) + V_p^2 f(2\omega)\right)$ |
| $v_s^3(\omega)$ | $\frac{1}{4}\left(-3V_p^3 f(\omega) + V_p^3 f(3\omega)\right)$ |
| $v_s^4(\omega)$ | $\frac{1}{8}\left(3V_p^4 f(0) - 4V_p^4 f(2\omega) + V_p^4 f(4\omega)\right)$ |
| $v_s^5(\omega)$ | $\frac{1}{16}\left(10V_p^5 f(\omega) - 5V_p^5 f(3\omega) + V_p^5 f(5\omega)\right)$ |

The Fourier transformation of the Taylor polynomial then yields:

$$I_s(\omega) = \left[x_1 v_s(\omega) + \frac{x_2}{2}v_s^2(\omega) + \frac{x_3}{6}v_s^3(\omega) + \frac{x_4}{24}v_s^4(\omega) + \frac{x_5}{120}v_s^5(\omega)\right]$$

which, after inserting the equations from Table 2 in the Taylor polynomial, may be separated by harmonic number of the currents $I_n(\omega)$ $$I_0 = \frac{-x_2}{4}V_p^2 \frac{3x_4}{64}V_p^4$$

$$I_1 = x_1(V_p)\frac{-x_3}{8}V_p^3 \frac{x_5}{192}V_p^5$$

$$I_2 = \frac{x_2}{4}V_p^2 \frac{-x_4}{48}V_p^4$$

$$I_3 = \frac{x_3}{24}V_p^3 \frac{-x_5}{384}V_p^5$$

$$I_4 = \frac{x_4}{192}V_p^4$$

$$I_5 = \frac{x_5}{1920}V_p^5$$

This set of equations may be solved, and $x_1$ may be determined by:

$$x_5 = \frac{1920I_5}{V_p^5}, \quad x_4 = \frac{192I_4}{V_p^4}$$

$$x_3 = \frac{24I_3}{V_p^3} + \frac{V_p^2 x_5}{16} = \frac{24I_3}{V_p^3} + \frac{V_p^2 1920I_5}{V_p^5 16} = \frac{24I_3}{V_p^3} + \frac{120I_5}{V_p^3} = \frac{24I_3 + 120I_5}{V_p^3}$$

$x_1 =$ $$\frac{I_1}{V_p} + \frac{x_3 V_p^2}{8} - \frac{x_5 V_p^4}{192} = \frac{I_1}{V_p} + \frac{24I_3}{8V_p} + \frac{120I_5}{8V_p} - \frac{1920I_5}{192V_p} = \frac{I_1}{V_p} + \frac{3I_3}{V_p} + \frac{5I_5}{V_p}$$

$$x_1(Y_1) = \frac{I_1 + 3I_3 + 5I_5}{V_p}$$

The 3rd and 5th harmonic current responses $I_3$ and $I_5$ may be measured, e.g., in terms of amplitude and phase. The first order admittance $x_1$ (also called $Y_1$) may then be determined as shown above. Here, the admittance is used for ease of explanation, but the equation may be converted to impedances in the usual way.

In the same manner, this correction may be extended to higher orders:

$$x_1(Y_1) = \frac{I_1 + 3I_3 + 5I_5 + 7I_7 + 9I_9 + \text{etc.}}{V_p}$$

adding terms as many as relevant. It can be seen that in general, the higher order responses may be added using as multiplicative factor the order itself, e.g., '3' for the third order response, '5' for the fifth order response, etc. In this respect, it is noted that for most practical situations, including a correction factor up to the 5th harmonic may be sufficient. It is further noted that for galvanostatic (controlled current perturbation) measurements, the derivation of the equations proceeds in the same manner as described above, but yields expressions in voltages, instead of currents.

Simulated Example 1: Electrical System

The effect of the correction may be simulated for an electronic system comprised of an ideal diode. The known equation for the ideal diode is:

$$I = (\exp(qV) - 1), \text{ with } 1/q = 26\text{mV at 300K}$$

When a voltage signal $v_s(w) = A\sin(\omega t)$ is applied as perturbation to this electrical system, with amplitude A and frequency $\omega$, the current response at the first harmonic in the Fourier domain may be calculated. In this calculated example, the sine expression is inserted in the exponent, thus creating a high resolution (4096 interval steps, 10 byte extended float precision) numerical result for the total current/time response over the signal period. This array of data is then analyzed with numerical Fourier analysis on the first harmonic. The above is repeated for every amplitude.

Figure 2:
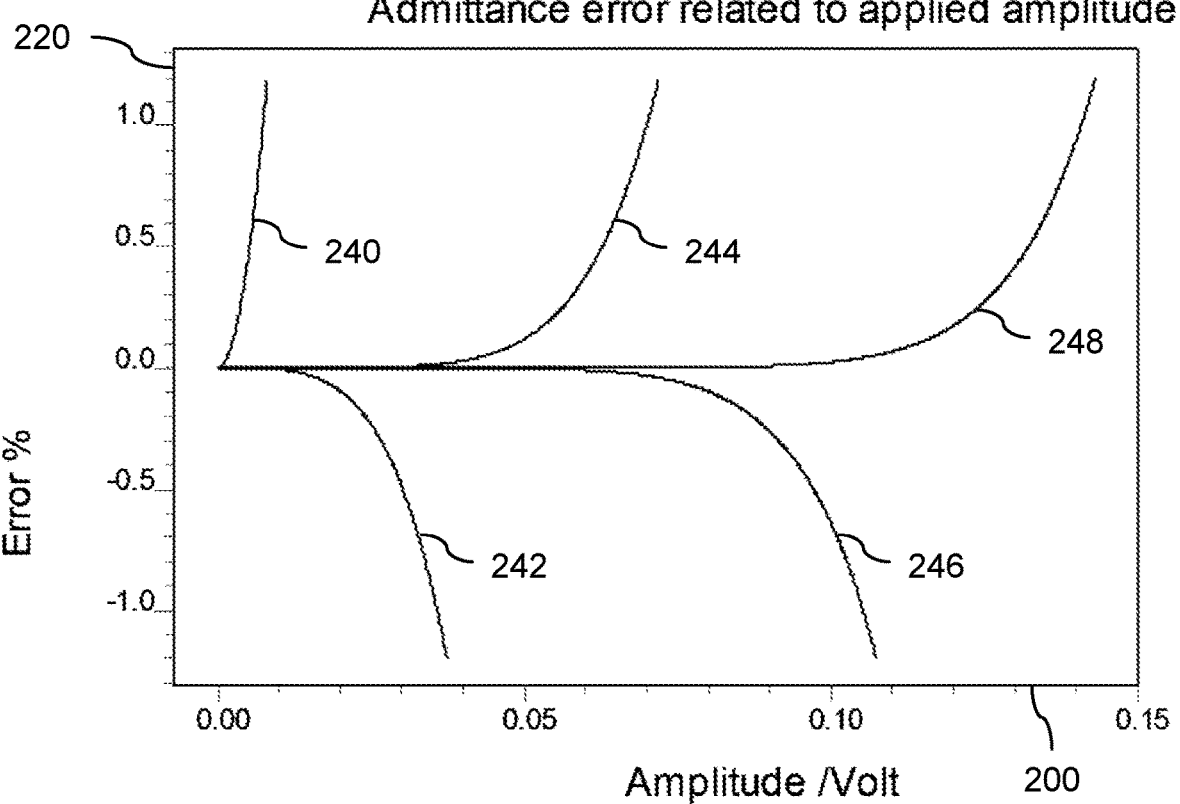
FIG. 2 shows a simulated error of the admittance of the first harmonic for an ideal diode ($I=(exp(V/0.026)-1)$) at increasing amplitudes.

The effect of the amplitude on the observed admittance can be calculated and its error determined as a function of various orders of correction. This is illustrated in FIG. 2, where along the horizontal axis 200 the amplitude A is shown in V and along the vertical axis 220 the error in the determined admittance in percentages. The curves in FIG. 2 represent the admittance error as a function of applied amplitude for a conventional method in which no correction is applied (curve 240), for a correction for the effect of the third order response on the first harmonic (curve 242), for a correction for the effect of the third order and fifth order response on the first harmonic (curve 244), for a correction for the effect of the third, fifth and seventh order response on the first harmonic (curve 246), and for correction for the effect of the third, fifth, seventh and nineth order response on the first harmonic (curve 248). The following Table 3 also shows numerical results for the different orders of correction shown in FIG. 2 for a 0.1% error and a 1% error as respective thresholds. From Table 3, it can be seen that the amplitude can be increased significantly already when only using third order correction, with the fifth order correction allowing an even larger amplitude range.

TABLE 3

Amplitude limits for accurate impedance measurements on a diode

| | 0.1% error | 1% error |
|---|---|---|
| uncorrected | A < 2.3 mV | A < 7.4 mV |
| $3^{rd}$ order corrected | A < 21 mV | A < 35 mV |

TABLE 3-continued

| Amplitude limits for accurate impedance measurements on a diode | | |
|---|---|---|
| | 0.1% error | 1% error |
| 3 &5$^{th}$ order corrected | A < 48 mV | A < 70 mV |
| 3, 5 & 7$^{th}$ order corrected | A < 80 mV | A < 105 mV |
| 3, 5, 7 & 9$^{th}$ order corrected | A < 114 mV | A < 140 mV |

It is noted that the above pertains to an ideal diode, but that in real-life, (non ideal) diodes may have a 1/q value that is slightly lower. This may result in larger amplitude limits compared to those of Table 3, but the magnitude of improvement between uncorrected and the various orders of correction will not change significantly. Therefore, the Table 3 values are deemed to be valid for most practical systems. Most commonly, amplitudes 10-50 mV are used in impedance measurements, meaning that the fifth order correction may be sufficient to obtain 99.9% accuracy.

Simulated Example 2: Electrochemical System

A well-known current/voltage relation for electrochemical reactions is the so-called Butler-Volmer Equation:

$$i = i_0 \cdot \exp\left[\frac{(1-\alpha)\cdot n \cdot F}{R \cdot T} \cdot (E - E_{eq})\right] - i_0 \cdot \exp\left[-\frac{\alpha \cdot n \cdot F}{R \cdot T} \cdot (E - E_{eq})\right]$$

The first part on the righthand side $$\left(i_0 \cdot \exp\left[\frac{(1-\alpha)\cdot n \cdot F}{R \cdot T} \cdot (E - E_{eq})\right]\right)$$

represents the forward reaction and the second part on the righthand side $$\left(i_0 \cdot \exp\left[-\frac{\alpha \cdot n \cdot F}{R \cdot T} \cdot (E - E_{eq})\right]\right)$$

the backward reaction. When the reactions are treated separately, the equations are identical to the diode equation, apart from the q value. For an electrochemical reaction with n=2 (electrons), and α=0.5, which are values common in practice, the 1/q value is identical to the diode 1/q=26 mV, meaning that the amplitude limits shown in Table 3 may also be used for electrochemical systems.

Experimental Example 1: Single Diode

Figure 3:
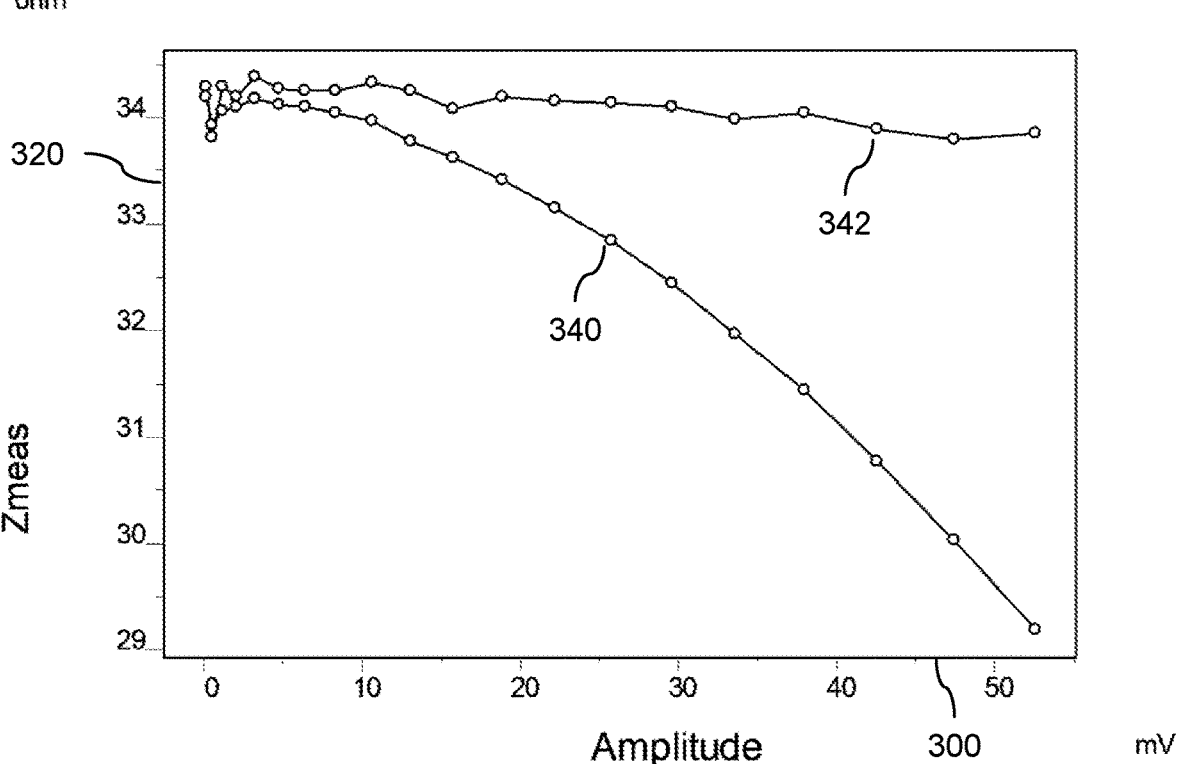
FIG. 3 shows experimental impedance results for a 1N4001 diode, at 0.6V bias, using 200 Hz as applied frequency at various amplitudes.

In FIG. 3, the effect of the correction is shown in practice by showing experimental impedance results for a 1N4001 diode, at 0.6V bias, using 200 Hz as applied frequency at various amplitudes set out along the horizontal axis 300 in mV, with the vertical axis 100 showing the impedance in ohm. FIG. 3 shows two curves: a curve 340 which represents a conventional impedance measurement without correction, and a curve 342 in which a 3rd and 5th order correction is applied to the impedance measurement. It can be seen that at larger amplitudes, in the curve 340 representing the uncorrected impedance measurement, the impedance is greatly dependent on the amplitude and decreases significantly at increasing amplitudes, thereby representing an error in the impedance measurement as predicted by theory. However, after the 3rd and 5th order corrections 342, the measured impedance is largely independent from the amplitude over the shown amplitude range of 0 to 50 mV.

Experimental Example 2: Electronic Network

Figure 4A:
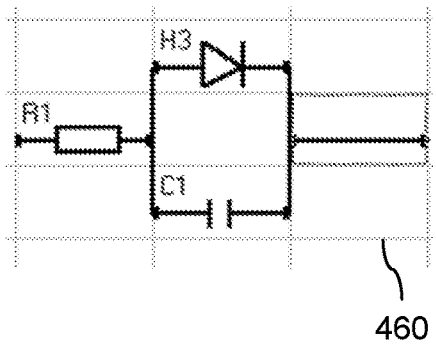
FIG. 4A shows an electronic network comprising a diode, resistor, and capacitor, with R1=1 ohm, C1=10 uF and H3 being a 1N4001-type rectifier diode.

The correction is deemed valid for any physical system regardless its complexity. To confirm this assumption, the impedance of an electronic network 460 with a diode, resistor and capacitor was measured. FIG. 4A shows the electronic network, in which R1=1 ohm, C1=10 uF and H3 is a 1N4001-type rectifier diode. The impedance measurement was repeated at various input frequencies, at which the impedance (magnitude and phase angle) was measured, and the correction applied.

Figure 4B:
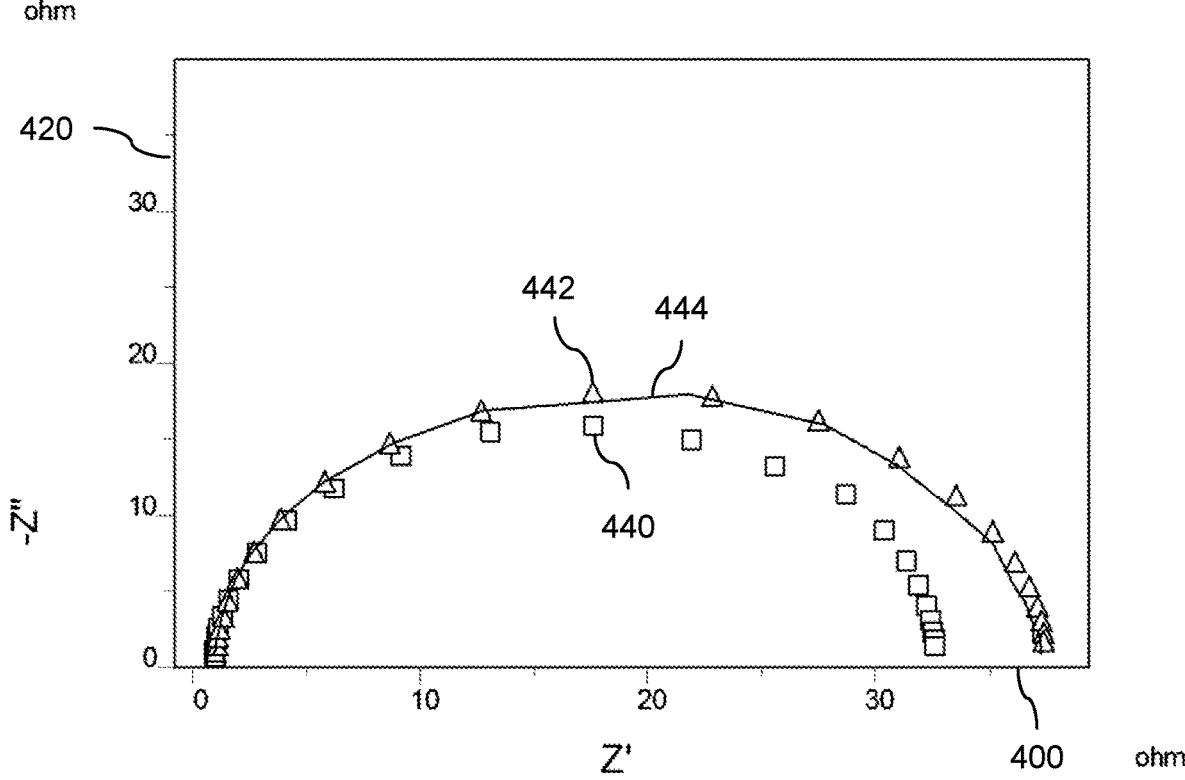
FIG. 4B shows a complex plane plot (Nyquist) of the real and imaginary part of the impedance for the electronic network shown at 20 kHz-20 Hz, 0.6 V bias.

FIG. 4B shows the so-called Nyquist plot which resulted from these measurements, showing the imaginary impedance on the vertical axis 420 plotted against the real impedance on the horizontal axis 400. In this plot, measurement points are shown for three series of measurements, namely a first series 440 in which 50 mV amplitude was used as input without correction, a second series 442 in which 5 mV amplitude was used as input without correction, and a third series 444 in which 50 mV amplitude was used with 3rd and 5th order correction. From FIG. 4B, it can be seen that the effect of the harmonic distortions on the impendence measurement is frequency dependent: at high frequencies (left side), the amplitude impact is small, whereas the amplitude dispersion is larger at lower frequencies (right side). When the correction is applied on the 50 mV amplitude experimental results, the curve 444 converges to the low amplitude (5 mV) curve 442, which means that when using the correction, an approximately ten times as high amplitude may be used as input. In addition, the results of FIG. 4B confirm the applicability of the correction on complex circuits.

Figure 5:
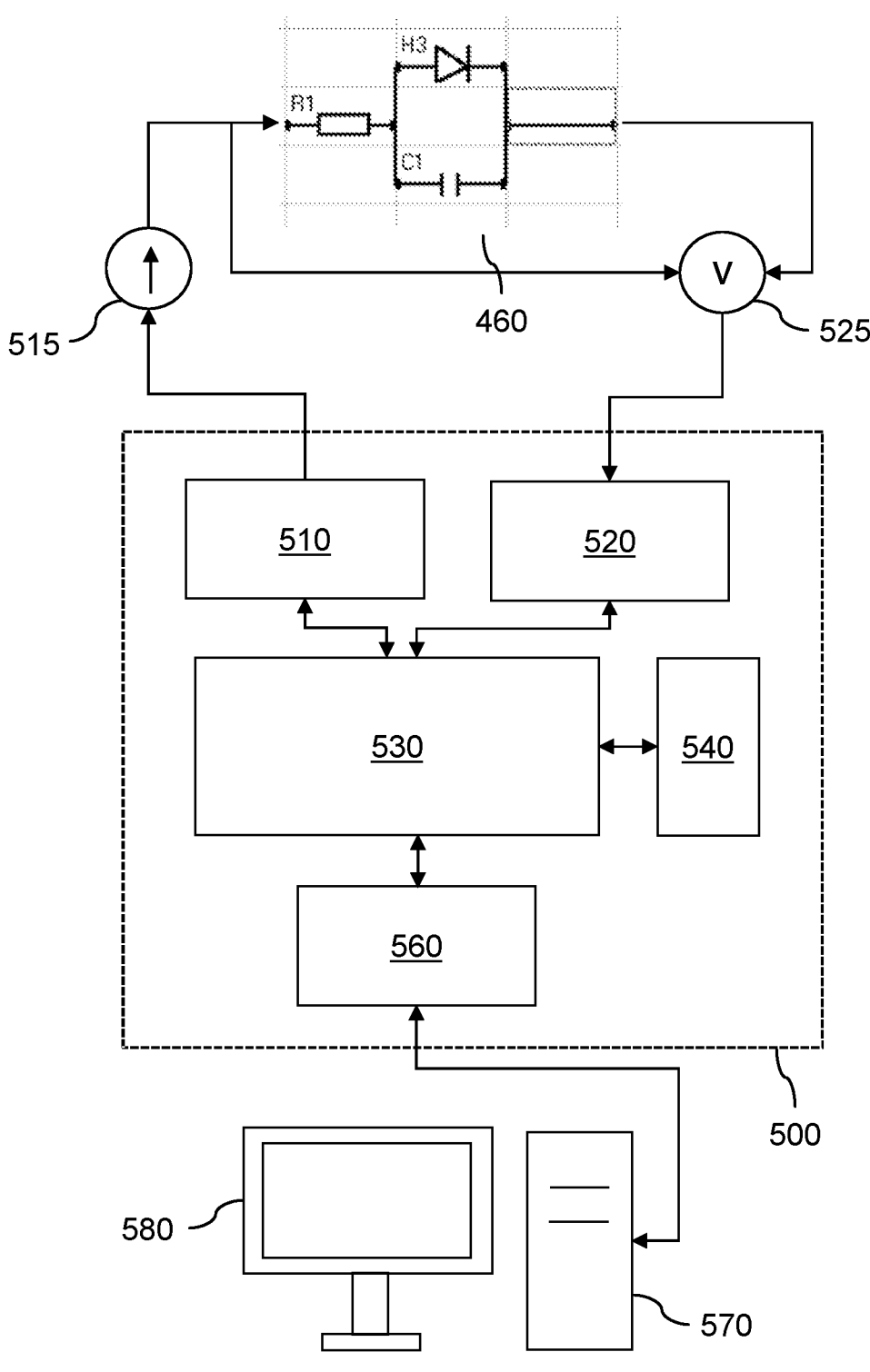
FIG. 5 shows a system for determining the impedance, which system is configured for correction of the impedance of the first harmonic.

FIG. 5 shows a system 500 for determining the impedance of a physical system. The system 500 is shown to comprise an interface 520 to a response measurement device through which interface 520 the system 500 may receive a measurement of a response of a physical system to a perturbation. By way of example, the physical system 460 is shown to be the electronic circuit of FIG. 4A which is perturbed by a current source 515, with the current source 515 generating a current at a given frequency and amplitude and the electronic circuit's response being measured by a voltmeter 525 which measures the voltage over the electronic circuit 460. In the example of FIG. 5, the system 500 further comprises an interface 510 to the perturbation source, e.g., to control the current source 515, e.g., to determine the frequency and amplitude. In other examples, the system 500 may comprise the perturbation source, e.g., as an internal component, in which case the interface 510 may be an internal interface. In yet other examples, the system 500 may alternatively or additionally comprise the response measurement device, e.g., the voltmeter 525, in which case the interface 520 may likewise be an internal interface of the system 500.

The system 500 is further shown to comprise a processor subsystem 530 and a memory 540. The memory 540 may store data representing instructions to cause the processor subsystem 530 to determine an impedance of the physical system based on a ratio of the perturbation and the response. In particular, the instructions may cause the processor subsystem 530 to convert the response signal into a frequency domain to identify a magnitude and phase of a first harmonic of the response signal and a magnitude and phase of a third harmonic of the response signal, express the magnitude and phase of the first harmonic as a first complex term and express the magnitude and phase of the third harmonic as a third complex term, and in determining the impedance, use as the response a sum of at least the first complex term and three times the third complex term. Thereby, a correction as described elsewhere in this specification may be applied to the impedance measurement of the first harmonic.

In the example of FIG. 5, the system 500 may be a stand-alone device, e.g., an impedance measurement device, which in some examples may be connectable to a computer 570 via an interface 560. For example, the interface 560 may be a USB interface or any other type of interface which allows the computer 570 to access the impedance measurement data and to display such data on a display 580. In some examples, the system 500 may also be configurable via the interface 560, e.g., to enable or disable the impedance correction or to configure the order of correction. In yet other examples, the system 500 itself may be embodied by a computer, such as a desktop computer or a laptop computer, which computer 500 may be connected via interfaces 510, 520 to a perturbation source and/or a response measurement device.

In general, the processor subsystem 530 of the system 500 may be embodied by a single CPU, such as a x86 or ARM-based CPU, but also by a combination of such CPUs and/or other types of processing units, such as microcontrollers. Although not shown in FIG. 5, the system 500 may also comprise additional components. For example, the system 500 may also comprise a data storage interface to a data storage to store the measurement data. Another example is that the system 500 may comprise a user input interface to a user input device, such as a touch screen, a set of buttons, etc., to enable a user to interact with the system 500. Yet another example is that the system 500 may comprise a display interface to a display to visualize output of the system 500, such as the measurement data.

In general, each entity described in this specification may be embodied as, or in, a device or apparatus. The device or apparatus may comprise one or more (micro)processors which execute appropriate software. The processor(s) of a respective entity may be embodied by one or more of these (micro)processors. Software implementing the functionality of a respective entity may have been downloaded and/or stored in a corresponding memory or memories, e.g., in volatile memory such as RAM or in non-volatile memory such as Flash. Alternatively, the processor(s) of a respective entity may be implemented in the device or apparatus in the form of programmable logic, e.g., as a Field-Programmable Gate Array (FPGA). Any input and/or output interfaces may be implemented by respective interfaces of the device or apparatus. Each functional unit of a respective entity may be implemented in the form of a circuit or circuitry. A respective entity may also be implemented in a distributed manner, e.g., involving different devices or apparatus.

Figure 6:
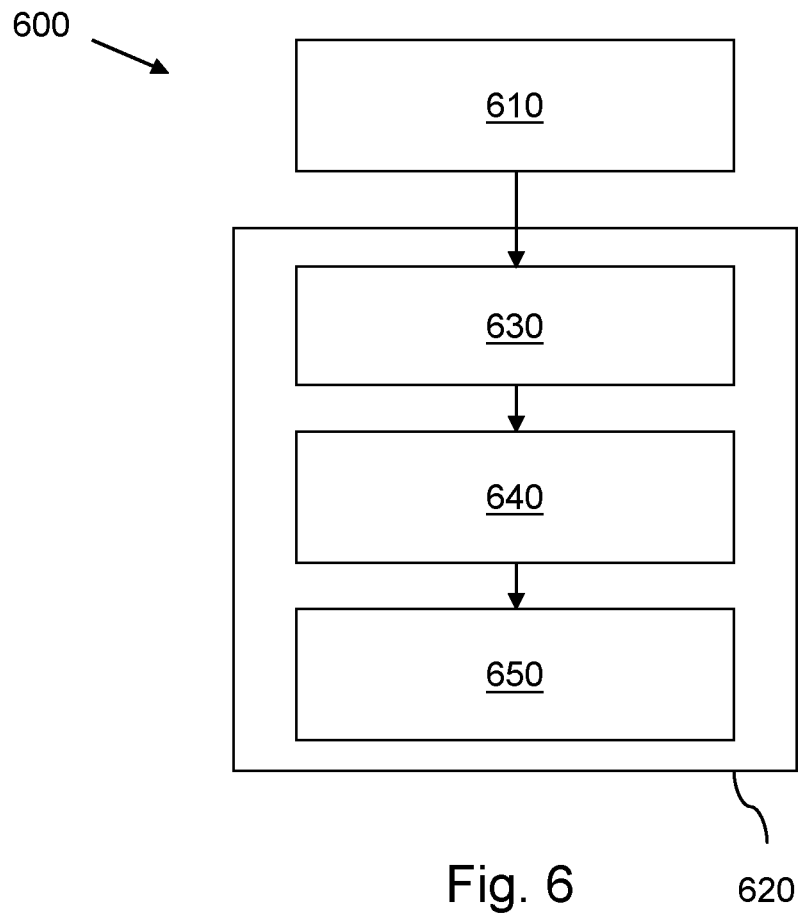
FIG. 6 shows a method of determining the impedance.

FIG. 6 shows a computer-implemented method 600 for determining an impedance of a physical system. The method 600 is shown to comprise, in a step titled "RECEIVING MEASUREMENT OF RESPONSE TO PERTURBATION", receiving 610 a measurement of a response of the physical system to a perturbation which is applied to the physical system and in a step titled "DETERMINING COMPLEX IMPEDANCE" determining 620 an impedance of the physical system based on a ratio of the perturbation and the response. The determining of the impedance is shown to comprise, in a step titled "CONVERTING RESPONSE TO FREQUENCY DOMAIN", converting 630 the response signal into a frequency domain to identify a magnitude and phase of a first harmonic of the response signal and a magnitude and phase of a third harmonic of the response signal, in a further step titled "EXPRESSING MAGNITUDE AND PHASE AS COMPLEX TERMS", expressing 640 the magnitude and phase of the first harmonic as a first complex term and expressing the magnitude and phase of the third harmonic as a third complex term, and in a further step titled "CORRECTING COMPLEX TERM OF FIRST HARMONIC", in determining the impedance, using 650 as the response a sum of at least the first complex term and three times the third complex term. It will be appreciated that, in general, the operations of method 600 of FIG. 6 may be performed in any suitable order, subject to, where applicable, a particular order being necessitated, e.g., by input/output relations.

Figure 7:
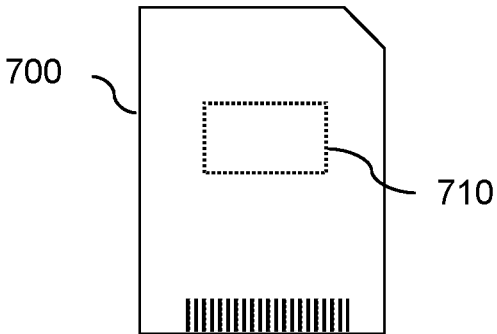
FIG. 7 shows a computer-readable medium comprising data.

It is noted that any of the methods described in this specification, for example in any of the claims, may be implemented on a computer as a computer implemented method, as dedicated hardware, or as a combination of both. Instructions for the computer, e.g., executable code, may be stored on a computer-readable medium 700 as for example shown in FIG. 7, e.g., in the form of a series 710 of machine-readable physical marks and/or as a series of elements having different electrical, e.g., magnetic, or optical properties or values. The executable code may be stored in a transitory or non-transitory manner. Examples of computer-readable mediums include memory devices, optical storage devices, integrated circuits, etc. FIG. 7 shows by way of example a memory device 700.

Examples, embodiments or optional features, whether indicated as non-limiting or not, are not to be understood as limiting the invention as claimed.

Mathematical symbols and notations are provided for facilitating the interpretation of the invention and shall not be construed as limiting the claims.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or stages other than those stated in a claim. The article "a" or "an" preceding an element does not exclude the presence of a plurality of such elements. Expressions such as "at least one of" when preceding a list or group of elements represent a selection of all or of any subset of elements from the list or group. For example, the expression, "at least one of A, B, and C" should be understood as including only A, only B, only C, both A and B, both A and C, both B and C, or all of A, B, and C. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:
1. A system for determining an impedance of a physical system, comprising:
an interface for receiving a measurement of a response of the physical system to a perturbation which is applied to the physical system, wherein the perturbation has a perturbation frequency, and wherein the measurement of the response is received in form of a response signal;

a processor subsystem configured to determine an impedance of the physical system based on a ratio of the perturbation and the response, wherein the determining of the impedance comprises:

converting the response signal into a frequency domain to identify a magnitude and phase of a first harmonic of the response signal and a magnitude and phase of a third harmonic of the response signal;

expressing the magnitude and phase of the first harmonic as a first complex term and expressing the magnitude and phase of the third harmonic as a third complex term; and in determining the impedance, using as the response a sum of at least the first complex term and three times the third complex term.

2. The system according to claim 1, wherein the processor subsystem is further configured to:

identify a magnitude and phase of a fifth harmonic of the response signal and express the magnitude and phase of the fifth harmonic as a fifth complex term;

in determining the impedance, use as the response the sum of at least the first complex term, three times the third complex term, and five times the fifth complex term.

3. The system according to claim 2, wherein the processor subsystem is further configured to:

identify a magnitude and phase of a seventh harmonic of the response signal and express the magnitude and phase of the seventh harmonic as a seventh complex term;

in determining the impedance, use as the response the sum of at least the first complex term, three times the third complex term, five times the fifth complex term, and seven times the seventh complex term.

4. The system according to claim 3, wherein the processor subsystem is further configured to:

identify a magnitude and phase of a nineth harmonic of the response signal and express the magnitude and phase of the nineth harmonic as a nineth complex term;

in determining the impedance, use as the response the sum of at least the first complex term, three times the third complex term, five times the fifth complex term, seven times the seventh complex term, and nine times the nineth complex term.

5. The system according to claim 1, wherein the processor subsystem is configured to estimate a signal-to-noise ratio of the measurement of the response signal and to determine which maximum order of odd harmonics to include in the sum based on the signal-to-noise ratio.

6. The system according to claim 5, wherein the processor subsystem is configured to, for a higher signal-to-noise ratio, limit the maximum order to a lower number.

7. The system according to claim 1, further comprising a response measurement device for measuring the response of the physical system, wherein the interface is an internal interface of the system.

8. The system according to claim 1, further comprising a perturbation source for generating the perturbation.

9. The system according to claim 1, wherein the perturbation is available to the system in form of a perturbation signal, wherein the perturbation signal represents a measurement of the perturbation.

10. The system according to claim 1, wherein the physical system is an electronical system or an electrochemical system or a biological system, wherein the perturbation is an alternating current, and wherein the response is a voltage.

11. The system according to claim 1, wherein the physical system is a mechanical system, wherein the perturbation is a harmonic force, and wherein the response is a resistance to the force.

12. The system according to claim 1, wherein the physical system is an optical system, wherein the perturbation is in form of emitted light, and wherein the response is in form of reflected or transmitted light or in form of an electrical response.

13. The system according to claim 1, wherein the physical system is an acoustic system, wherein the perturbation is an acoustic pressure, and wherein the response is an acoustic volume flow rate.

14. A computer-implemented method for determining an impedance of a physical system, comprising:

receiving a measurement of a response of the physical system to a perturbation which is applied to the physical system, wherein the perturbation has a perturbation frequency, and wherein the measurement of the response is received in form of a response signal;

determining an impedance of the physical system based on a ratio of the perturbation and the response, wherein the determining of the impedance comprises:

converting the response signal into a frequency domain to identify a magnitude and phase of a first harmonic of the response signal and a magnitude and phase of a third harmonic of the response signal;

expressing the magnitude and phase of the first harmonic as a first complex term and expressing the magnitude and phase of the third harmonic as a third complex term; and in determining the impedance, using as the response a sum of at least the first complex term and three times the third complex term.

15. A transitory or non-transitory computer-readable medium comprising data representing a computer program, the computer program comprising instructions for causing a processor system to perform the method according to claim 14.

* * * * *